United States Patent [19]

Sterler et al.

[11] Patent Number: 4,788,446
[45] Date of Patent: Nov. 29, 1988

[54] MONITORING CIRCUIT FOR AN ELECTRIC OR ELECTRONIC MODULE

[75] Inventors: Georg Sterler, Grossmehring; Heinz Bader, Karlshuld, both of Fed. Rep. of Germany

[73] Assignee: Audi AG, Ingolstadt, Fed. Rep. of Germany

[21] Appl. No.: 60,311

[22] Filed: Jun. 10, 1987

[30] Foreign Application Priority Data

Jun. 27, 1986 [DE] Fed. Rep. of Germany ....... 3621589
Jun. 27, 1986 [DE] Fed. Rep. of Germany ....... 3621590

[51] Int. Cl.⁴ .......................... H01H 85/30; H02J 1/00
[52] U.S. Cl. ................................................. 307/10 R
[58] Field of Search ............ 307/10 R; 280/728, 734, 280/735; 337/241, 242

[56] References Cited

U.S. PATENT DOCUMENTS 3,916,376 10/1975 Tuttle .............................. 280/735 X
4,158,191 6/1979 Rogers et al. ................... 280/735 X
4,641,041 2/1987 Mattes et al. ................... 280/728 X

OTHER PUBLICATIONS

"Simple Headlight Reminder Alarm", published by Electronics Australia; vol. 43, No. 9, p. 88, Sep. 1981.

Primary Examiner—Bentsu Ro
Attorney, Agent, or Firm—Lalos & Keegan

[57] ABSTRACT

An electric or electronic module provides an error indication through a display unit. The display unit indicates power failure to the module in addition to an error indication. Power failure to the display unit results in power failure to an operationally essential component of the apparatus in which the module is installed, thereby providing a secondary power-fail indicator.

6 Claims, 2 Drawing Sheets

MONITORING CIRCUIT FOR AN ELECTRIC OR ELECTRONIC MODULE

This invention relates to an electric or electronic circuit for supplying power to an electric/electronic module and for testing the operability of the module.

A particular application of the present invention is in an automobile airbag system. The module supplied with power and monitored for operability is the trigger circuit for the airbag release.

Given the importance of the airbag system to human safety, it is desirable to provide an indication of its operability to the vehicle operator. In prior art systems, (e.g., French Pat. No. 2,232,830) a circuit failure is indicated by a display lamp. However, failure of the lamp is not accounted for in the monitoring circuit. Power is supplied to the airbag trigger circuit by means of a fuse-protected lead. In the prior art, the display lamp is also supplied power by the lead and fuse. As a result, failure of the fuse results in failure of power to the release circuit and also the lamp intended to signal a circuit malfunction.

Accordingly, it is an object of the present invention to provide an improved monitoring circuit for an electric or electronic module.

A further object of the present invention is to provide an improved monitoring circuit which provides an indication of module inoperability even if power to the module is disabled.

A still further object of the present invention is to provide an improved circuit that provides a secondary indication of module failure when the primary indicator is inoperative.

Other objects and advantages of the present invention will become more apparent to those persons having ordinary skill in the art to which the present invention pertains from the following description when taken in conjunction with the accompanying drawings in which.

Figure 1:
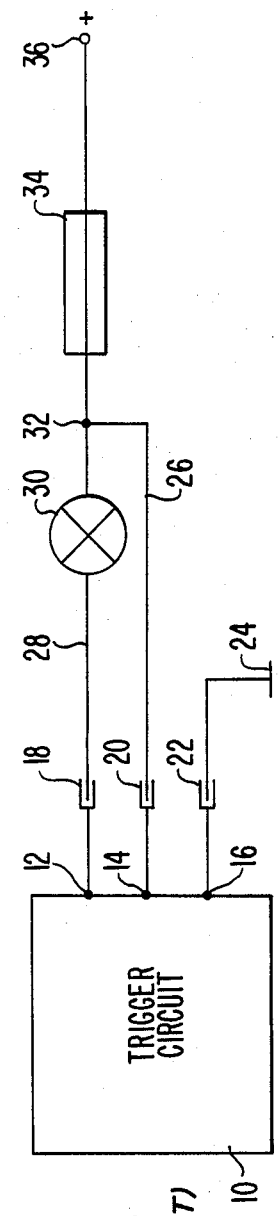
FIG. 1 is a schematic diagram of the monitoring circuit currently employed in vehicles.

Referring to FIG. 1, the trigger circuit or module for an airbag release system is designated generally as 10. The trigger circuit or electronic module 10, used only as an example, is conventional and its operation is not necessary for an understanding of the present invention.

The module 10 is shown having three leads. Lead 14 is utilized for the positive power input and lead 16 is utilized for the ground connection. Lead 12 is utilized as an error display lead and is connected to lamp 30 by conductor 28. Lamp 30 is activated in response to a predetermined condition on lead 12 to provide an indication that module 10 is inoperative. Lamp 30 can of course be replaced by any suitable indicator, e.g., an audible alarm or audio response unit.

Power supply 36 is connected to power supply lead 14 of module 10 through fuse 34 and conductor 26. Conductor 26 branches at node 32 to provide power to lamp 30. Over voltage protection for both lamp 30 and module 10 is thereby provided by fuse 34. The external connections of lamp 30, power supply 36 and ground 24 are made with module 10 by means of cable plug connectors 18, 20 and 22 for easy replaceability.

Module 10 will customarily include an error control unit which monitors the function of module 10 and alters the voltage level on error display lead 12 in response to detection of an error. The operation of module 10 or its error control unit is conventional and not important to an understanding of the present invention. The voltage on error display lead 12 is positive or undefined (i.e., open circuit) during normal operation. If an error in module 10 is detected, lead 12 is connected to ground through a conventional switch. As a result, a complete circuit is established for current flow from voltage source 36 through fuse 34, nodal point 32, lamp 30 and grounded lead 12. Activation of lamp 30 will thereby provide an error display indication to a vehicle operator.

However, a major disadvantage of the circuit of FIG. 1 is that failure of fuse 34 breaks the circuit and lamp 30 cannot provide any indication of an error or power-fail condition. A vehicle operator will assume that the airbag system is functional when in fact it has been completely inactivated by the failure or fuse 34.

Figure 2:
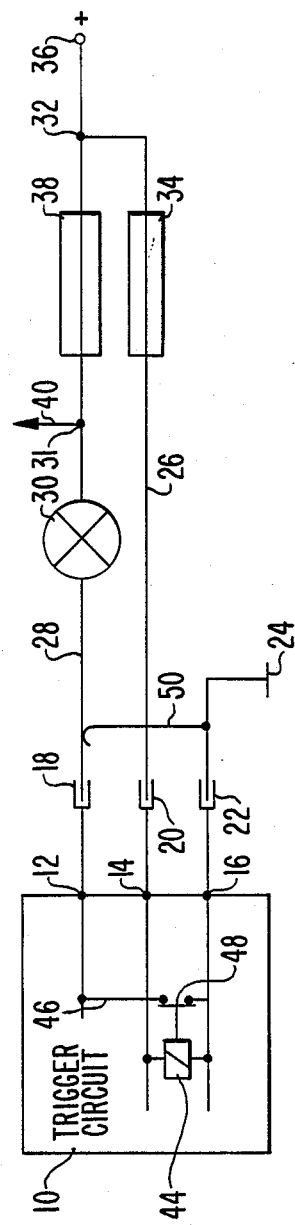
FIG. 2 is a schematic diagram of a first embodiment of the monitoring circuit of the present invention.

The circuit of the present invention, shown in FIG. 2, overcomes this disadvantage. Referring to FIG. 2, the over voltage protection fuse 34 for module 10 is no longer in series with lamp 30. Fuse 34 is now connected between nodal point 32 and positive supply lead 14 so that the operability of lamp 30 is not dependent on fuse 34.

In addition to lamp 30, the circuit of the present invention supplies a secondary indication to the vehicle operator so that failure of power to lamp 30 will not result in false indication of the airbag operability. Lamp 30 is connected on its positive voltage side to nodal point 31. At nodal point 31, a positive voltage 40 is taken as a supply voltage to another component of the vehicle in which module 10 is installed. This component will either be essential to the vehicle's operation or at least clearly noticeable to the operator if it is not functioning. For example the ignition system of the vehicle can be supplied with voltage 40 so that absence of voltage 40 from nodal point 31 will prevent the vehicle from starting. As another example, the vehicle's electronic tachometer could be made dependent on voltage 40. Failure of the tachometer would be clearly noticeable by the operator. Fuse 38, connected between nodal points 31 and 32 protects the ignition system, tachometer, etc., from damage.

As a result of the present invention, a break in fuse 34 supplying power to module 10 will not prevent an error indication in lamp 30. In addition, if power supplied to lamp 30 is interrupted due to a break in fuse 38, the operator is immediately notified by a secondary indication.

FIG. 2 further illustrates an embodiment of an error detection circuit that operates to activate lamp 30 if power to module 10 is insufficient or completely absent. Power supply lead 14 and ground lead 16 are connected to an activating unit, shown for example as a semiconductor, solenoid-type relay 44. Relay contact 48 of relay 44 is shown in an open-circuit position whereby the circuit formed between error display lead 12, connecting lead 46, and ground lead 16 is incomplete.

When the power supply voltage on lead 14 drops below a threshold value, the solenoid armature of relay 44 is de-energized and relay contact 48 is extended to complete the circuit between error display lead 12 and ground lead 16. With error display lead 12 grounded, current will flow through lamp 30 providing an error indication to the operator.

In the operation of the circuit of FIG. 2, normally supply voltage for module 10 is provided by voltage source 36 through nodal point 32, fuse 34, conductor 26, plug contact 20 and power supply lead 14. If adequate voltage is present on lead 14, relay 44 is energized and relay contact 48 is in the open-circuit position. If an error is detected in module 10, error display lead 12 is grounded by the error control unit of module 10 in a conventional manner. As in the operation of the circuit of FIG. 1, lamp 30 will be activated through current flow in the circuit formed by grounded lead 12, plug contact 18, conductor 28, lamp 30, nodal point 31 and fuse 38.

If fuse 34 fails, relay 44 will no longer be energized by voltage on lead 14 and relay contact 48 will be extended to the closed-circuit position, thus electrically connecting error display lead 12 to ground lead 16. As a result, current flows through the completed circuit of voltage source 36, nodal point 32, fuse 38, lamp 30, conductor 28, plug contact 18, and error display lead 12 connected to ground.

With the circuit configuration shown in FIG. 2, lamp 30 can provide not only an indication of a module 10 error but also an indication of failure of power to the module 10. As shown in FIG. 2, the circuit includes a short-circuit plug 50, which provides an additional error indication. Plug 50 is configured such that if the plug contacts 18, 20 and 22 are open, conductor 28 will be directly grounded to ground 24. As a result, lamp 30 will be activated and provide an indication if the plug contacts are open.

Figure 3:
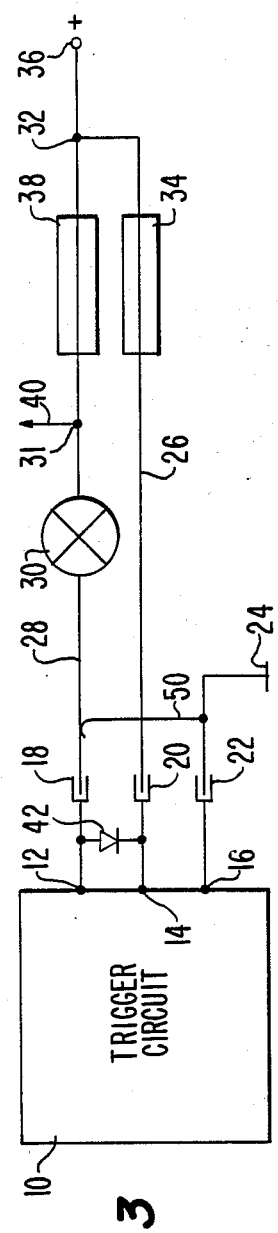
FIG. 3 is a schematic diagram of a second embodiment of the monitoring circuit of the present invention.

An alternative embodiment of the present invention is shown in FIG. 3. A diode 42 is connected between error display lead 12 and power supply lead 14 of module 10. The anode of diode 42 is connected to lead 12 and the cathode of diode 42 is connected to lead 14. If fuse 34 fails, current flows through the circuit from power supply 36 to power supply lead 14 by way of nodal point 32, fuse 38, nodal point 31, lamp 30, conductor 28, plug contact 18, and diode 42.

The circuit path is connected in parallel to the normal power supply path through fuse 34 and would normally conduct negligible current due to the high resistance of lamp 30. However, if fuse 34 fails, the current path through lamp 30 is the only conducting path available to module 10. Failure of fuse 34 will cause lamp 30 to light and provide an indication of failure of the power supply or module 10. Failure of fuse 38, which would open the circuit to lamp 30 and prevent it from being activated, would also disable the voltage 40 from being supplied to another vehicle component, e.g., ignition system or fuel pump. Failure of fuse 38 will thereby cause a disruption in the operation of another vehicle component noticeable to the operator.

Lamp 30 may comprise a safety lamp that switches to an alternate bulb or unit in the event the lamp 30 itself fails. From the foregoing detailed description, it will be apparent that there are a number of changes, adaptations, and modifications of the present invention that come within the province of those persons having ordinary skill in the art to which the present invention pertains. However, it is intended that all such variations not departing from the spirit of the invention be considered as within the scope thereof as limited solely by the appended claims.

We claim:

1. A power supply and error indicating circuit for a first electric unit, said first electric unit including an error lead and a power lead, said circuit including a power source connected to said power lead of said first electric unit, an error indicating means connected to said error lead of said first electric unit, and a fuse connected in series between said power source and said error indicating means, said circuit including an electrical connection between said fuse and said error indicating means for providing power to a second electric unit, whereby failure of said fuse resulting in failure of power to said error indicating means also results in failure of power to said second electric unit, said circuit further including a second fuse connected between said power source and said power lead of said first unit, said second fuse being connected in parallel with said first fuse, and said circuit including an electrical conducting diode connected between said error lead and said power lead, said diode conducting in the direction of said power lead, whereby failure of said second fuse results in current flow through said diode and said error indicating means thereby providing an error indication.

2. A power supply and error indicating circuit for a first electric unit, said first electric unit including an error lead and a power lead, said circuit including a power source connected to said power lead of said first electric unit, an error indicating means connected to said error lead of said first electric unit, and a fuse connected in series between said power source and said error indicating means, said circuit including an electrical connection between said fuse and said error indicating means for providing power to a second electric unit, whereby failure of said fuse resulting in failure of power to said error indicating means also results in failure of power to said second electric unit, said circuit further including a relay connected between said power lead and a ground lead of said first electric unit, said relay including a contact means for electrically connecting said error lead to said ground lead in response to a reduction of power on said power lead, whereby said error lead connected to said ground lead results in current flowing through said error indicating means thereby providing an error indication when power to said first electric unit is reduced.

3. A circuit according to claim 1 or 2 wherein said first electric unit is a trigger circuit for a vehicle airbag release system.

4. A circuit according to claim 3 wherein said second electric unit is the ignition system of said vehicle.

5. A circuit according to claim 3 wherein said second electric unit is the fuel supply system of said vehicle.

6. A circuit according to claim 3 wherein said second electric unit is the tachometer of said vehicle.

* * * * *